(12) United States Patent
Arai et al.

(10) Patent No.: US 6,386,708 B1
(45) Date of Patent: May 14, 2002

(54) PROJECTION DISPLAY DEVICE

(75) Inventors: Jun Arai, Matsumoto; Akira Tominaga, Hotaka-machi; Masayuki Suyama, Matumoto, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/342,599

(22) Filed: Jun. 29, 1999

(30) Foreign Application Priority Data

Jun. 30, 1998 (JP) .......................................... 10-185465

(51) Int. Cl.⁷ .......................... G03B 21/00; G02F 1/00; H04B 10/00
(52) U.S. Cl. ........................ 353/31; 359/109; 359/152; 359/154
(58) Field of Search ............................ 353/30, 31, 122, 353/78, 74; 359/152, 153, 154, 109; 250/551

(56) References Cited

U.S. PATENT DOCUMENTS

| | | | | |
|---|---|---|---|---|
| 3,887,277 A | * | 6/1975 | Tepper | ........................ 353/103 |
| 4,612,670 A | * | 9/1986 | Henderson | .................. 359/110 |
| 5,051,601 A | * | 9/1991 | Atobe et al. | ................. 250/551 |
| 5,392,148 A | * | 2/1995 | Takahashi et al. | .......... 359/152 |
| 5,806,950 A | * | 9/1998 | Gale et al. | ..................... 353/78 |
| 5,822,099 A | * | 10/1998 | Takamatsu | .................. 359/153 |
| 5,951,136 A | * | 9/1999 | Furuhata et al. | .............. 353/31 |

* cited by examiner

Primary Examiner—Alan A. Mathews
Assistant Examiner—R. Fuller
(74) Attorney, Agent, or Firm—Oliff & Berridge, PLC

(57) ABSTRACT

A projection display device permits extension of a space for mounting an electronic component on a control circuit substrate. The projection display device includes a control circuit substrate on which a control circuit is mounted for controlling driving of each of apparatuses in the device according to the input operation signal from an external light receiving unit; and a signal transmission circuit comprising a light emitting element and a light receiving element and provided in a conduction passage on the circuit substrate. The control circuit substrate includes a first circuit substrate on which the control circuit is mounted, and a second circuit substrate provided opposite to the first circuit substrate, and to which the operation signal is input from the external light receiving unit. The light receiving element and the light emitting element are provided on the first circuit substrate and the second circuit substrate, respectively.

9 Claims, 9 Drawing Sheets

PROJECTION DISPLAY DEVICE

BACKGROUND OF THE INVENTION

1. Field of Invention

The present invention relates to a projection display device having a control circuit substrate on which a control circuit is mounted for controlling driving of the device according to an input operation signal from an external apparatus connected to the device, and particularly to a projection display device having a structure in which a signal transmission element having an opposite light emitting element and light receiving element is provided in a passage for transmitting an external input signal to a control circuit on a control circuit substrate.

2. Description of Related Art

When a signal generated in a first circuit substrate is transmitted from the first circuit substrate to a second circuit substrate and decoded by signal decoding means arranged on the second circuit substrate, it is generally necessary to draw a wire cable such as a lead wire from the first circuit substrate to the second circuit substrate. Namely, communication between the circuit substrates is performed by using electric signals. In this case, where the distance between the first circuit substrate and the second circuit substrate is relatively long, or electrical noise occurs between the first circuit substrate and the second circuit substrate, means for intensifying electric signals or means for removing noise is required. Further, where the voltage of an electric signal handled in the first circuit substrate is different from that in the second circuit substrate, means for converting the voltage of an electric signal is required.

In a product such as a projection display device, in which various electric devices and optical systems are arranged in a compact device case, and many circuits are arranged for controlling driving of these devices, a plurality of circuit substrates must be arranged, thereby requiring signal transmission and reception between the circuit substrates. Conventionally, the circuit substrates are connected by cables so that such signal transmission and reception is carried out by using electric signals.

However, in realization of miniaturization of a product (device), miniaturization is difficult because a space is required for providing a connector for connecting cables and for drawing the cables between a first circuit substrate and a second circuit substrate, for example, in order to transmit a signal from the first circuit substrate to the second circuit substrate.

Where a relatively large electric noise occurs in the product, or a long cable must be used, it is necessary to arrange a transmission buffer on the first circuit substrate and a receiving buffer and means (noise filter) for removing noise on the second circuit substrate. Particularly, the projection display device has noise sources such as a light source lamp driven at a high voltage, and an image signal processing circuit for handling digital signals, and thus requires such buffers and noise removing means.

Furthermore, where the voltage of an electric signal handled by the first circuit substrate is different from that in the second circuit substrate, means for converting the voltage is also required.

Arrangement of the buffers, the noise removing means and the voltage converting means on the circuit substrates not only interferes with miniaturization of the product but also causes an increase in the product cost.

SUMMARY OF THE INVENTION

The present invention has been achieved in consideration of the above problem, and an object of the invention is to provide means for communication between circuit substrates, which permits miniaturization of a device and cost reduction.

In order to achieve the object, a projection display device of the present invention includes a light source; an optical system for optically processing the light emitted from the light source to form an optical image corresponding to image information; a projection lens for projecting the image formed by the optical system on a projection plane; a device case for containing at least the light source and the optical system; a control circuit substrate contained in a predetermined space in the device case, for mounting a control circuit for controlling drive of the device; an external apparatus connecting terminal provided on the control circuit substrate so that the control circuit is operated by an input operation signal from an external apparatus; and a signal transmission circuit including a light emitting element and a light receiving element and provided in an external input signal transmission passage between the terminal and the control circuit; the control circuit substrate including a first circuit substrate on which the control circuit and the light receiving element are provided, and a second circuit substrate which is arranged opposite to the first circuit substrate, and on which the external apparatus connecting terminal and the light emitting element are provided.

Since the control circuit substrate includes the first and second circuit substrates, a space for mounting electronic components on the control circuit substrate is extended.

Since the light emitting element and light receiving element serving as a signal transmission circuit are provided opposite to each other between the first and second circuit substrates, a space for mounting electronic components on each of the circuit substrates is also extended.

Since a plurality of circuit substrates are provided, various external apparatus connecting terminals can be provided on the circuit substrates. Also, since the external apparatus connecting terminal is provided on the second circuit substrate without the control circuit, many other external apparatus connecting terminals can be provided on the first circuit substrate.

Since a medium for communication from the first circuit substrate to the second circuit substrate comprises optical signals, there is no need for a space for providing a connector for connecting cables and drawing the cables between the first circuit substrate and the second circuit substrate, thereby permitting close arrangement of the first and second circuit substrates. In addition, since optical signals are not affected by noise sources such as a light source lamp driven at a high voltage and an image signal processing circuit, there is no need for a buffer and noise removing means, which are needed in a conventional device.

Even when the voltage of a signal handled by the first circuit substrate is different from that in the second circuit substrate, the voltage of a signal can be changed by using the light emitting element and the light receiving element having desired photoelectric conversion efficiency, and thus another voltage converting means need not be provided.

Therefore, the present invention causes extension of a space for mounting electronic components, and a decrease in a space for containing the control circuit substrate, thereby achieving high-density mounting and a compact device. Also, the degree of layout freedom for arrangement of other external apparatus connecting terminals is increased.

In the projection display device of the present invention, the first circuit substrate preferably comprises a main circuit substrate on which the control circuit is mounted, and a sub-circuit substrate electrically connected to the main circuit substrate, disposed between the main circuit substrate and the second circuit substrate, and provided with the light receiving element.

Since the control circuit substrate comprises the three circuit substrates, the space for mounting electronic parts is further extended, and more external apparatus connecting terminals can be provided on the circuit substrates.

Therefore, it is possible to achieve higher-density mounting or more compact control circuit substrate, that is, a more compact device.

In the projection display device of the present invention, the light receiving element is preferably provided on a side of the first circuit substrate which faces the second circuit substrate with the light receiving plane parallel to the first circuit substrate, and the light emitting element is preferably provided with a light emission portion opposite to a light receiving plane of the light receiving element.

The amount of projection (height) of the light emitting element and the light receiving element from the circuit substrates are smaller than those in a case where the light emitting element and light receiving element are provided in a standing condition on the circuit substrates. There is thus a lower possibility that the light emitting element and light receiving element contact other members or the like in the step of mounting other electronic components on the control circuit substrate and the step of assembling the control circuit substrate in the device case, thereby facilitating the step of mounting electronic components, and the step of assembling the control circuit substrate.

Where the light emitting element and the light receiving element are provided in a standing condition on the circuit substrates, the height of the light emitting element must be adjusted so that the light emission plane of the light emitting element coincides with the light receiving plane of the light receiving element, thereby causing difficulties in the work. Also, a spacer must be interposed in a leg (lead wire) of the light emitting element in order to adjust the height and prevent from falling of the light emitting element. However, since the light emitting element and light receiving element are respectively provided along the surfaces of the circuit substrates, there is no problem of requiring adjustment of the height of the light emitting element and the spacer, thereby simplifying the construction of the first circuit substrate.

In the projection display device of the present invention, the end of a lead wire led out of the light emission portion of the light emitting element is preferably mounted to the surface of the second circuit substrate, and the lead wire is preferably bent along the surface of the second circuit substrate.

By bending the lead wire, the light emission portion can be disposed in parallel with the second circuit substrate, and thus the spacer for supporting the lead wire need not be provided.

In the present invention, the light emission portion of the light emitting element is preferably provided so that at least the end thereof projects from the side edge of the second circuit substrate.

Since the light emitting element is mounted at a position near the side edge of the second circuit substrate, the space for mounting electronic components on the second circuit substrate is extended, thereby enabling high-density mounting of the control circuit substrate or achievement of a compact device. Since the light emitted from the light emitting element is not intercepted by the second circuit substrate, the light emitting element can be mounted on either of the surface and rear sides of the second circuit substrate.

In the projection display device of the present invention, a notch is preferably formed at a side edge of the second circuit substrate so that the light emitting element is provided with at least a portion of the light emission portion projecting into the notch.

Since the light emitting element is provided within the second circuit substrate (does not project outward from the second circuit substrate), the light emitting element is less likely to contact other members. In addition, since the light emitting element does not project outward from the second circuit substrate, the space for containing the second circuit substrate in the device can be narrowed in the length direction of the circuit substrate.

Therefore, the light emitting element does not project upward and outward from the second circuit substrate, thereby facilitating handling of the second circuit substrate, and narrowing the space for mounting the circuit substrate in the length direction of the circuit substrate, that is, making the device compact.

In the projection display device of the present invention, the light emitting element is preferably mounted on the surface side of the second circuit substrate which is opposite to the first circuit substrate.

The light emitting element can be soldered to the second circuit substrate by one time of solder flow together with other electronic components to be mounted on the second circuit substrate, thereby facilitating mounting of the light emitting element.

In the projection display device of the present invention, the light emitting element is preferably mounted on the surface side of the second circuit substrate, which faces the first circuit substrate.

Since the light emitting element is absent on the side of the second circuit substrate where electronic components are mounted, the space for mounting the electronic components on the second circuit substrate is extended. Also, the light emission portion of the light emitting element is located closer to the light receiving plane of the light receiving element than a case where the light emitting element is mounted on the electronic part mounting side of the second circuit substrate, thereby permitting correct transmission of external input signals.

Therefore, the electronic part mounting space on the second circuit substrate is extended, thereby permitting high-density mounting of the control circuit substrate or achievement of a compact device.

Since the light emission portion of the light emitting element is located closer to the light receiving plane of the light receiving element, thereby achieving correct transmission of external input signals.

In the projection display device of the present invention, the first circuit substrate is preferably arranged along the side wall of the device case, and the second circuit substrate is preferably arranged in a substantially triangular space formed between the optical system and the device case.

The substantially triangular space between the optical system and the device case in the device case can effectively be employed as a circuit substrate containing portion.

Therefore, the space in the device case is effectively utilized, thereby achieving a further compact device.

DETAILED DESCRIPTION OF PREFERRED EMBODIMENTS

An embodiment of the present invention will be described below.

Figure 1:
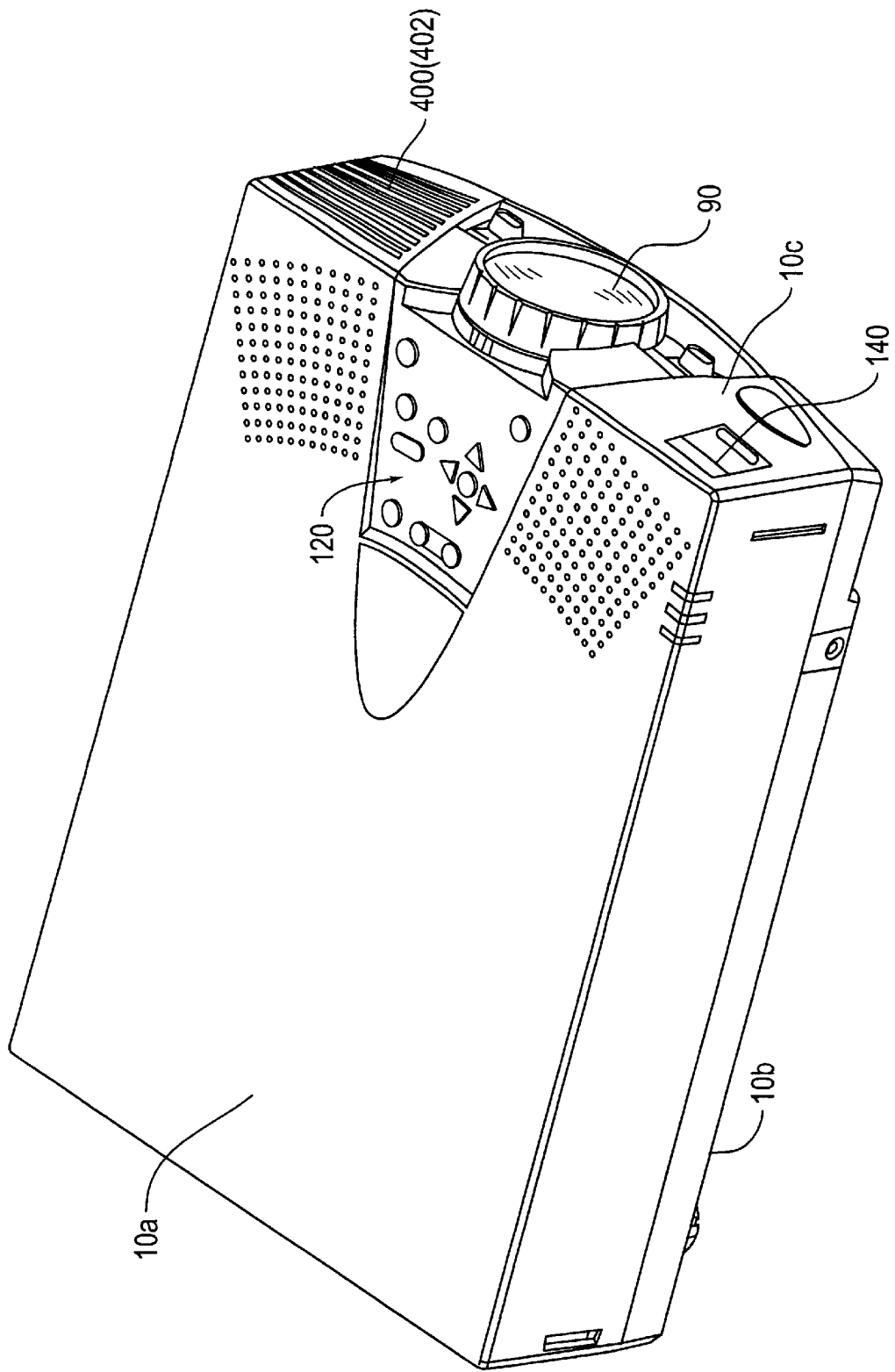
FIG. 1 is a perspective view of a projection display device in accordance with an embodiment of the present invention.
Figure 2:
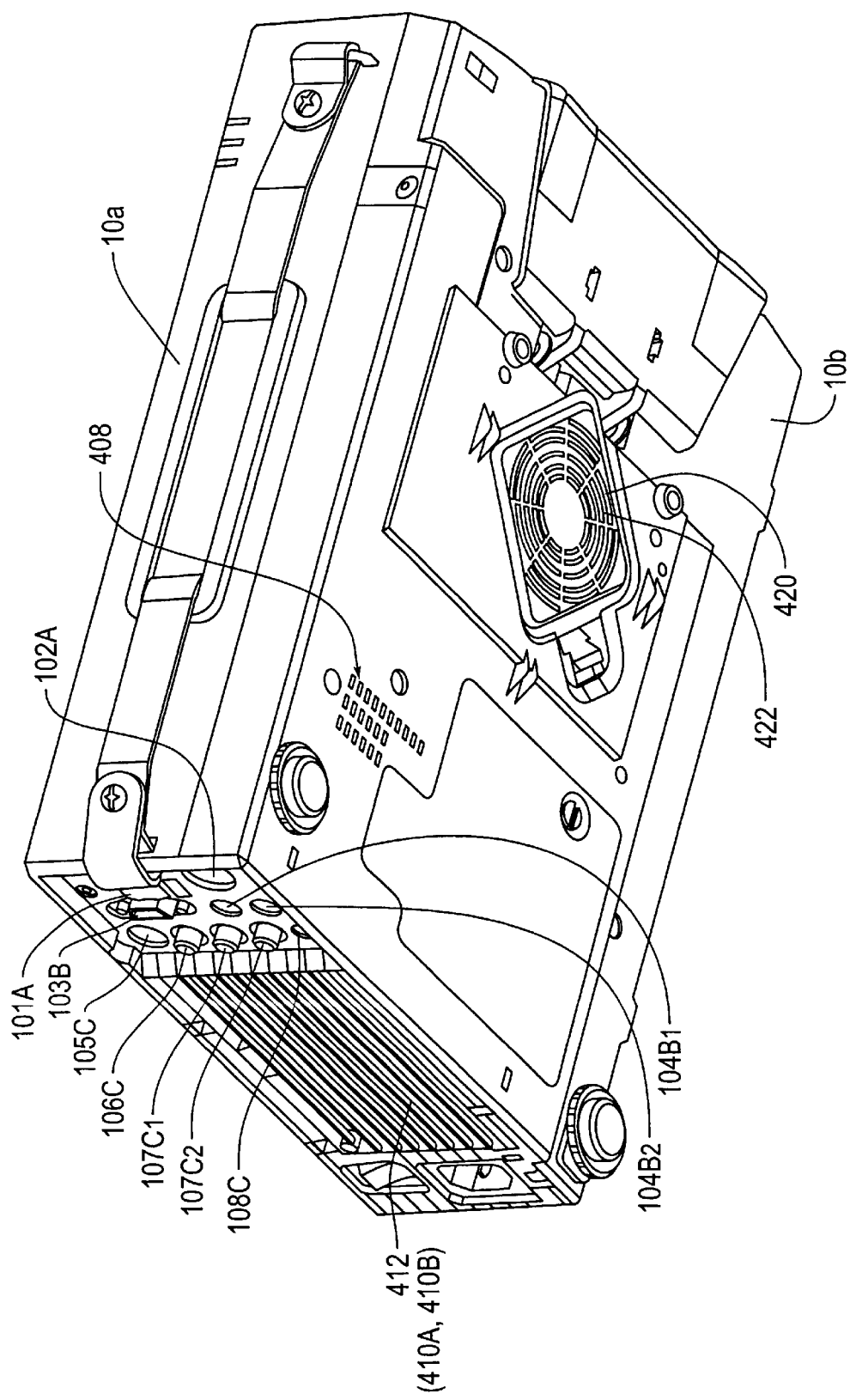
FIG. 2 is a perspective view of the projection display device as viewed from the lower rear side.
Figure 3:
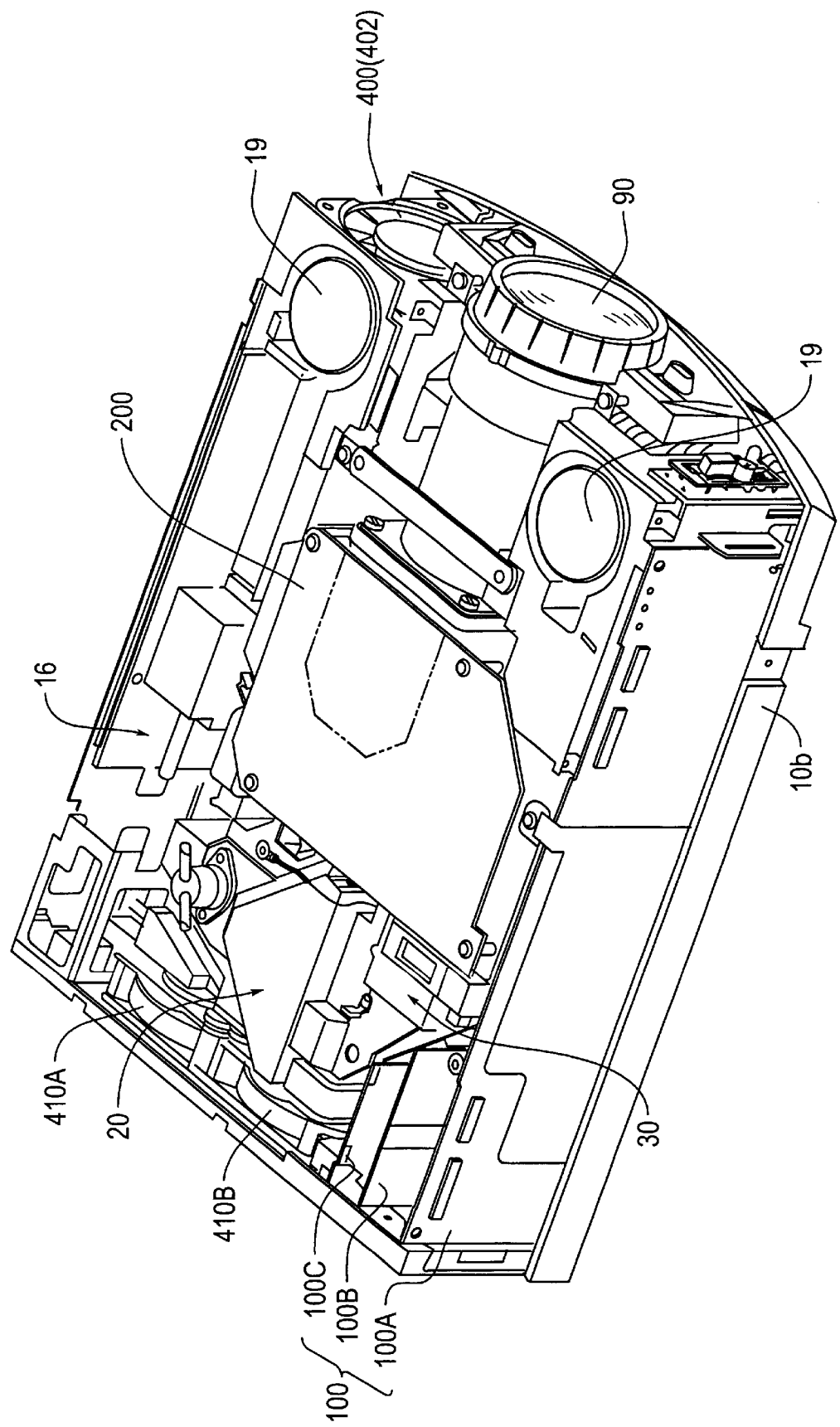
FIG. 3 is a perspective view of the projection display device with an upper case removed.
Figure 4:
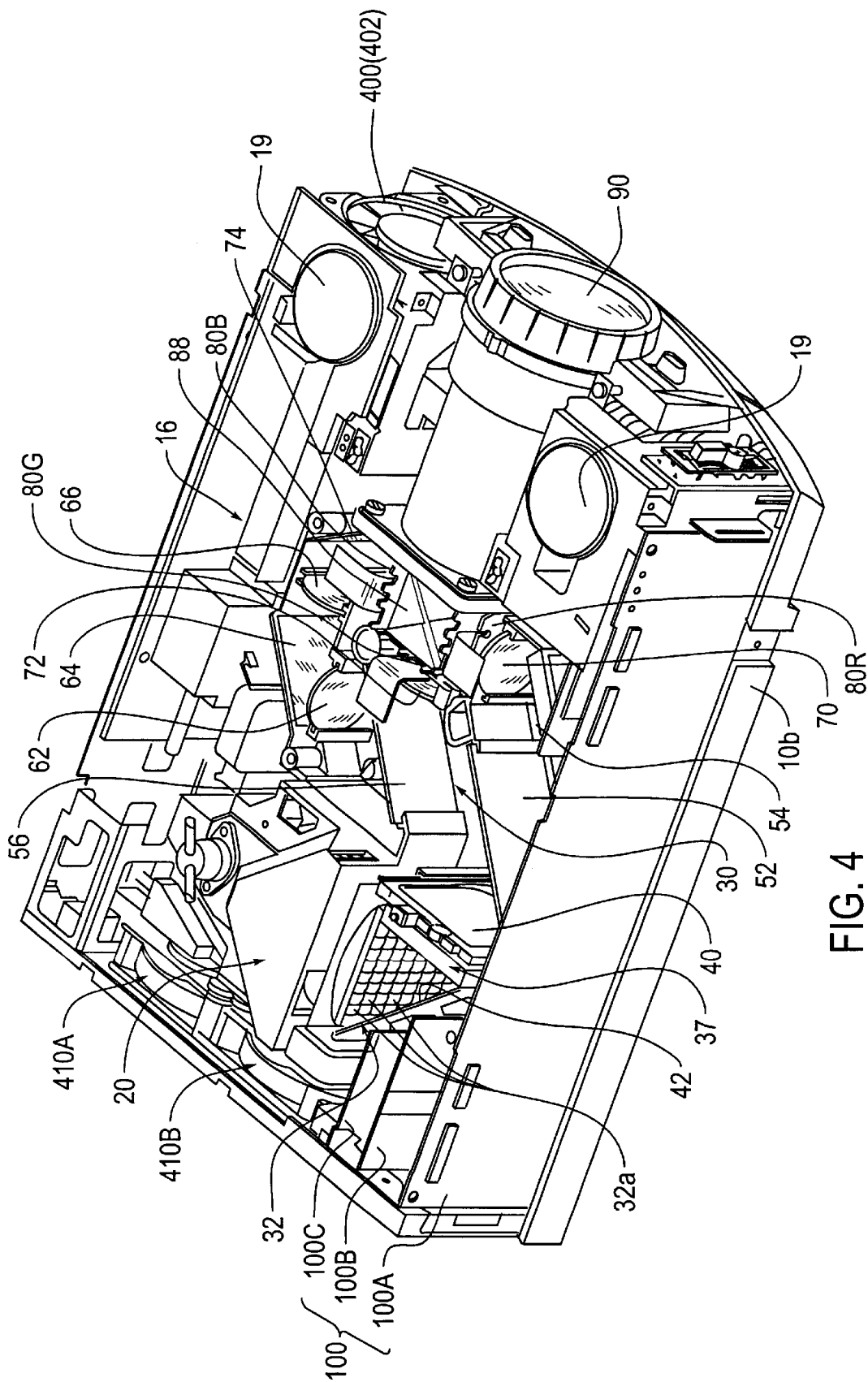
FIG. 4 is a perspective view of the projection display device with an upper light guide removed to expose an optical system in a light guide.
Figure 5:
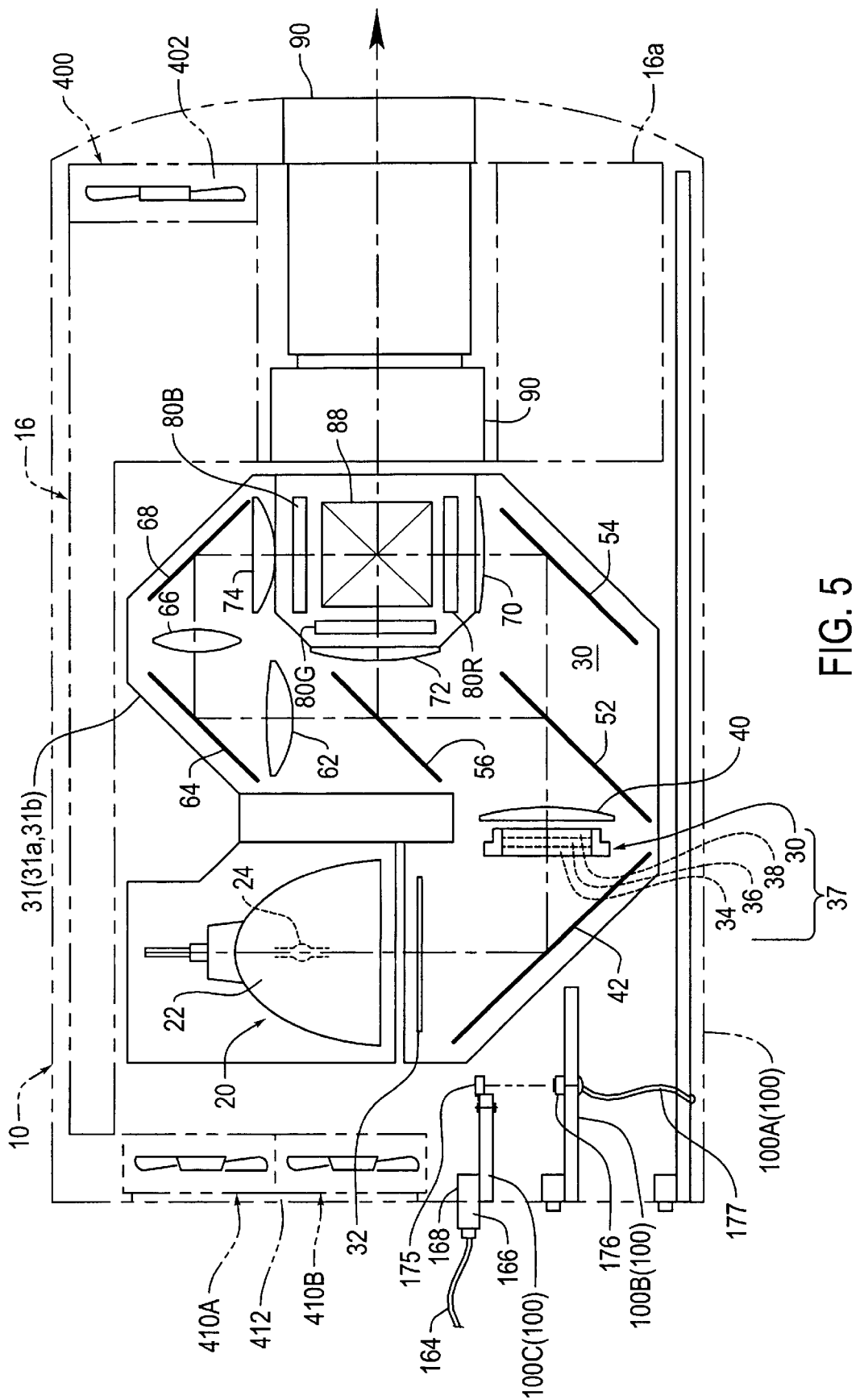
FIG. 5 is a plan view showing the arrangement of an optical system and a control circuit substrate of the projection display device.
Figure 6:
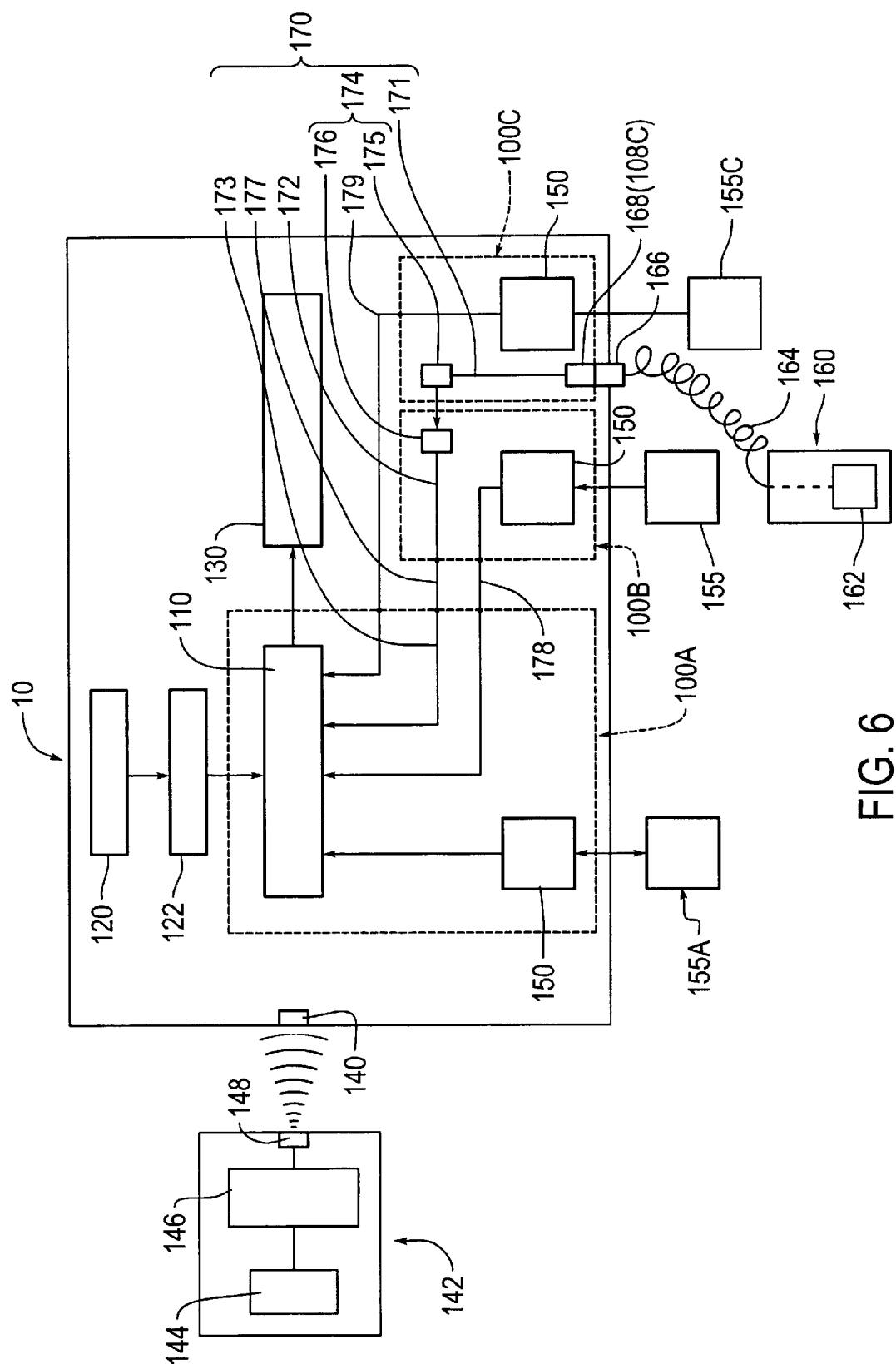
FIG. 6 is a block diagram showing the function of the projection display device to which an external light receiving unit is connected.
Figure 7:
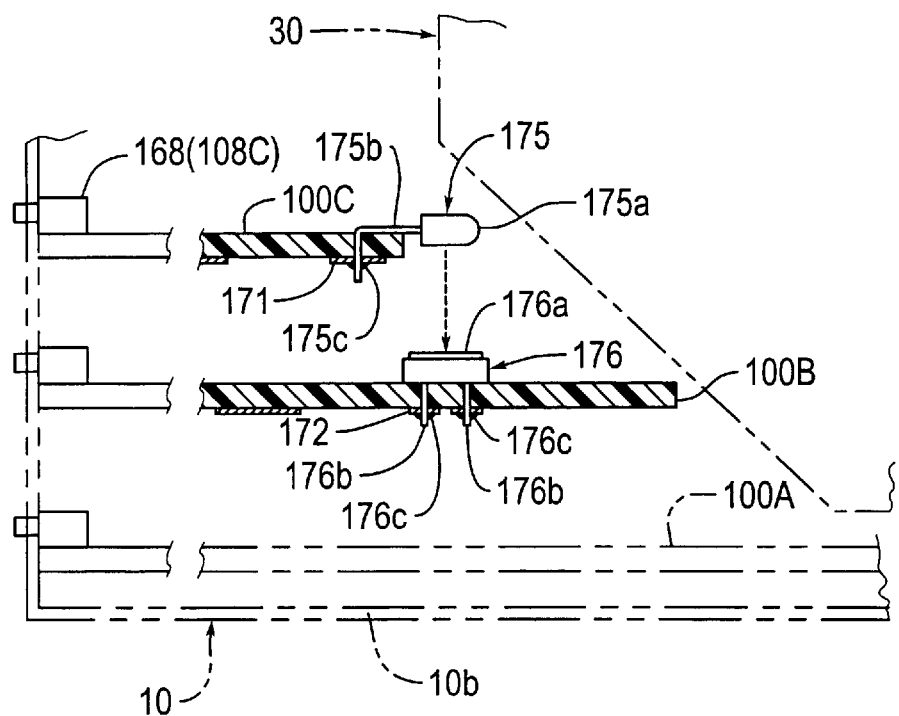
FIG. 7 is, an enlarged horizontal sectional view of the periphery of signal transmission circuit (signal level decreasing circuit) provided between circuit substrates.

FIGS. 1 to 7 show a projection display device in accordance with an embodiment of the present invention, in which FIG. 1 is a perspective view of the projection display device in accordance with the embodiment of the present invention, FIG. 2 is a perspective view of the projection display device as viewed from the lower rear side, FIG. 3 is a perspective view of the projection display device with an upper case removed, FIG. 4 is a perspective view of the projection display device with an upper light guide removed to expose an optical system in a light guide, FIG. 5 is a plan view showing the arrangement of an optical system and a control circuit substrate in the projection display device, FIG. 6 is a block diagram showing the functions of the projection display device to which an external light receiving unit is connected, and FIG. 7 is an enlarged sectional view of the periphery of signal level decreasing circuit (light emitting diode and light receiving diode).

In these drawings, the projection display device comprises a light source unit 20 in which a light source 24 is integrally mounted to a reflector 22; an optical unit 30 in which an integrator optical system, a polarization conversion optical system, a color separation optical system, a relay optical system, a field lens, and the like are contained in a light guide 31; liquid crystal light valves 80R, 80G, and 80B for modulating lights of three colors guided by the optical unit 30; a dichroic prism 88 for synthesizing the lights modulated by the liquid crystal light valves 80R, 80G and 80B; and a projection lens 90 for enlarging and projecting the image light synthesized by the dichroic prism 88; all of which are contained in a rectangular outer case 10. The outer case 10 comprises an upper case 10a, a lower case 10b and a front case 10c which defines the front side of the device, the end of the projection lens 90 being exposed at the center of the front of case 10.

The light source unit 20 is arranged on the rear side of the case 10 opposite to the projection lens 90 provided on the front side of the case 10 so that the optical axis is perpendicular to the optical axis of the projection lens 90. In FIGS. 3 to 5, reference numeral 16 denotes a power unit arranged along the side of the case 10, a portion 16a of the power unit 16 being arranged on the opposite side with the projection lens 90 held therebetween.

The optical unit 30 comprises optical members such as a first lens array 32, a second lens array 34, a shielding plate 36, a polarization conversion element array 38, a superposing lens 40, reflecting mirrors 42, 54, 64, and 68, dichroic mirrors 52 and 56, lenses 62, 66, 70, 72, and 74, and the like, which are contained between upper and lower light guides 31a and 31b, as shown in FIGS. 3 to 5. The light guide 31 is fixed to the lower case 10b by fixing screws.

As shown in FIG. 4, the first lens array 32 comprises small lenses 32a having a rectangular contour and arranged in a matrix form, and the first lens array 32 and the lens 40 constitute the integrator optical system for dividing the light emitted from the light source unit 10 into a plurality of light flux parts, and superposing the light flux parts on the liquid crystal light valves 80R, 80G, and 80B.

The first lens array 32 is arranged on the light emission side of the light source unit 20, and a polarization conversion unit 37 in which the second lens array 34, the shielding plate 36 and the polarization conversion element array 38 are integrated is arranged substantially perpendicularly to the first lens array 32 with the reflecting mirror 42 held therebetween.

The polarization conversion unit 37 constitutes the polarization conversion optical system for converting a plurality of light flux parts emitted from the light source unit 20 and divided by the first lens array 32 to a type of polarized light.

The dichroic mirrors 52 and 56 constitute the color separation optical system for separating the light emitted from the superposing lens 40 into blue light, green light and red light. Namely, the dichroic mirror 52 transmits the red light component of the light emitted from the superposing lens 40, and reflects the blue light component and the green light component. The red light passing through the dichroic mirror 52 is reflected by the reflecting mirror 54, passes through the field lens 70 and then reaches the liquid crystal light valve 80R for red light. The field lens 70 converts each of the light fluxes emitted from the superposing lens 40 to a light flux parallel to the center axis (main optical axis) thereof. This applies to the field lenses 72 and 74 provided in front of the other liquid crystal light valves 80G and 80B, respectively.

The green light reflected by the dichroic mirror 52 is reflected by the dichroic mirror 56, passes through the field lens 72 and reaches the liquid crystal light valve 80G for green light. On the other hand, the blue light is transmitted through the dichroic mirror 56, passes through the relay optical system comprising the incident side lens 62, the reflecting mirror 64, the relay lens 66, and the reflecting mirror 68, and the field lens 74, and reaches the liquid crystal light valve 80B for blue light.

The three liquid crystal light valves 80R, 80G and 80B have the function as light modulation elements for modulating incident light according to the obtained image information (image signal). Therefore, the color light emitted from each of the liquid crystal light valves 80R, 80G and 80B is modulated according to the obtained image information to form an image of each color light.

The modulated lights of the three colors emitted from the three liquid crystal light valves 80R, 80G and 80B are incident on the cross dichroic prism 88. The cross dichroic prism 88 has the function as a color light synthesis portion for synthesizing the three modulated lights to form a color image. The cross dichroic prism 88 comprises a dielectric multilayered film for reflecting red light and a dielectric multilayered film for reflecting blue light, which are formed in substantially an X shape in the interfaces between four rectangular prisms. The three modulated lights are synthesized by the dielectric multilayered films to form synthetic light for projecting a color image. The synthetic light produced by the cross dichroic prism 88 is emitted toward the projection lens 90. The projection lens 90 has the function to project the synthetic light on a projection screen to display the color image on the projection screen.

As shown in FIGS. 3, 4 and 5, three control circuit substrates 100 (a main circuit substrate 100A, an audio circuit substrate 100B, and a video circuit substrate 100C) for controlling the functions of the projection display mechanism are arranged in parallel in the longitudinal direction of the device by the side of the optical unit 30. The main circuit substrate 100A is arranged along the side wall of the outer case 10, and the audio circuit substrate 100B and the video circuit substrate 100C are arranged in the space having a substantially triangular plane and formed between the optical unit 30 and the outer case 10. In a case where the mirror 42 which reflects a light beam toward a direction perpendicular to the incident direction of the light beam is provided in the outer case 10, there exists a space having a triangular prism shape in the outer case 10.

In the present embodiment, the space having a triangular prism shape is effectively utilized with the three circuit substrates, i.e., the main circuit substrate 100A, audio circuit substrate 100B and the video circuit substrate 100C, because the lengths of respective circuit substrates, along a direction perpendicular to the height direction of the space having a triangular prism shape, are different from each other. In the present embodiment, the lengths of the main circuit substrate 100A, the audio circuit substrate 100B, and the video circuit substrate 100C are about 296 mm, 66 mm and 50 mm, respectively.

Also a control circuit substrate 200 (refer to FIG. 3) for controlling drives of the liquid crystal light valves 80R, 80G and 80B is arranged above the optical unit 30, and speakers 19 are respectively arranged at the right and left corners of the upper side of the device on the front side thereof.

Also, an air intake fan 400 and an air inlet 402 are provided on the front side of the case 10, for taking air into the case 10, and exhaust fans 410A and 410B and an exhaust port 412 are provided on the rear side of the case 10, for exhausting air in the case 10 to the outside thereof. In addition, an intake port 408 serving as an air intake for cooling the polarization conversion element array 38 (refer to FIG. 5) in the optical unit 30, and an intake fan 420 and an intake port 422 for cooling the dichroic prism 88 are provided at the bottom of the case 10.

The intake fans 400 and 420 and the exhaust fans 410A and 410B are driven to flow rearward the air taken as cooling air from the intake ports in the case 10, and exhaust the air through the exhaust port 412 provided at the rear end of the case 10, thereby cooling each of the power unit 16, the light source unit 20, the polarization conversion unit 37 and the liquid crystal light valves 80R, 80G and 80B.

FIG. 6 is a block diagram showing the functions of the projection display device of this embodiment to which an external light receiving unit is connected.

Driving of the projection display mechanism 130 is controlled by the three control circuit substrates 100 (100A, 100B and 100C) contained in the outer case 10 in the region from the side to the rear side corner thereof, as shown in FIGS. 3 to 5. Namely, the control circuit substrate 100 comprises the main circuit substrate 100A as a first circuit substrate on which the control circuit comprising an arithmetic and control unit 110 comprising CPU, memory and the like is mounted, and a terminal for connecting an external apparatus 155A is provided, the audio circuit substrate 100B as a first circuit substrate (sub-circuit substrate) on which a terminal for connecting an external apparatus 155B is provided, and the video circuit substrate 100C as a second circuit substrate on which a terminal for connecting an external apparatus 155C is provided. Operation keys 120 (refer to FIG. 1) provided on the upper case 10a are operated to operate the arithmetic and control unit 110 to control driving of the projection display mechanism 130. Reference numeral 122 denotes a signal processing unit for converting an operation signal by the operation keys 120 into a digital signal.

Also, an infrared light receiving portion 140 (refer to FIG. 1) is provided on the front side of the device so that the control circuit (the arithmetic and control unit 110) can be operated by a remote controller 142. Namely, an operation signal input from an operation key 144 of the remote controller 142 is converted into a digital signal by the signal processing unit 146, and transmitted from an infrared light emission portion 148 to the infrared light receiving portion 140 in a wireless manner. The infrared light receiving portion 140 converts the received signal to an electric signal (digital signal), and outputs the signal to the arithmetic and control unit 110. The arithmetic and control unit 110 performs arithmetic processing of the input signal to control driving of the projection display mechanism 130.

An interface 150 and external apparatus connecting terminal are provided on each of the circuit substrates 10A, 100B and 100C to permit connection of various external apparatus 155A, 155B and 155C. Namely, FIG. 2 shows various terminals provided on the rear side of the device, and a RGB image input terminal 101A and a mouse control terminal 102A are provided on the main circuit substrate 100A so that the external apparatus 155A such as a personal computer and a mouse can be connected through these terminals. The electric signals input to the terminals are input to the arithmetic and control unit 110 through the interface 150.

Also, a RGB image output terminal 103B, an audio speech output terminal 104B, and audio speech input terminal 104B$_2$ are provided on the audio circuit substrate 100B so that audio external apparatus 155B such as a stereo, CD player, a speaker and the like can be connected through these terminals. The electric signals input to the terminals are input to the audio circuit substrate 100B through the interface 150, input to the main circuit substrate 100A through a lead wire 178 as an electric wiring for connecting the audio circuit substrate 100B and the main circuit substrate 100A, and then input to the arithmetic and control unit 110.

In addition, a S video input terminal 105C, a video image input terminal 106C, a video speech L input terminal 107C$_1$, and a video speech R input terminal 107C$_2$ are provided on the video circuit substrate 100C so that external apparatus 155C such as a video deck and the like can be connected through these terminals. The electric signals input to the terminals are input to the video circuit substrate 100C through the interface 150, input to the main circuit substrate 100A through a lead wire 179 as an electric wiring for connecting the video circuit substrate 100C and the main circuit substrate 100A, and then input to the arithmetic and control unit 110.

Also, a light receiving unit connecting terminal 108C for connecting the external light receiving unit 160 comprising the infrared light receiving portion 162 and the transmission cord 164 is provided on the video circuit substrate 100C so that the external light receiving unit 160 can receive an infrared signal output from the remote controller 142 to operate the arithmetic and control unit 110.

For example, when the device is hung from a ceiling and used in a state where the device-side light receiving portion 140 is difficult to receive infrared light from the remote controller 142, the external light receiving unit 160 is held on a wall or the like so that driving of the device can be controlled by operating the remote controller 142 for the light receiving portion 162 of the external light receiving unit 160.

Namely, the infrared signal transmitted from the remote controller 142 in a wireless manner is received by the light receiving portion 162, converted into an electric signal (digital signal) and then input to the arithmetic and control unit 110 of the main circuit substrate 100A through the transmission cord 164, the terminal 108C and the signal transmission passage 170 in the device. Reference numeral 166 denotes a light receiving unit side connector, and reference numeral 168 denotes a device side connector.

The signal transmission passage 170 comprises a conduction passage 171 in the video circuit substrate 100C; a conduction passage 172 in the audio circuit substrate 100B; a conduction passage 173 extending in the arithmetic and control unit 110 of the main circuit substrate 100A; a light emitting diode 175 and a light receiving diode 176 both of which are provided as a light emitting element and light receiving element, respectively, between the conduction passages 171 of the video circuit substrate 100C and 172 of the audio circuit substrate 100B; a signal level decreasing circuit 174 serving as signal transmission circuit for converting an electrical signal to an optical signal and transmitting the signal; and a lead wire 177 as an electric wiring provided between the conduction passages 172 and 173 of the audio circuit substrate 100B and the main circuit substrate 100A.

Although the signals input from other external apparatus (a video deck, a personal computer, a stereo, a CD player, and the like) except the external light receiving unit 160 and the signals input from the infrared light receiving portion 140 are set at a potential of about 1.2 to 1.4 V, the electric signals output from the light receiving portion 162 are set to a potential of as high as 12 V in consideration of a transmission loss of the transmission cord 164 extending for several meters. However, from the viewpoint of effect on an electronic circuit, it is undesirable to input the signals at such a potential (12 V) to the control circuit (the arithmetic and control unit 110). Thus, the signal level decreasing means 174 comprising the light emitting diode 175 and the light receiving diode 176 having predetermined photoelectric conversion efficiency is provided between the conduction passages 171 and 172, which are included in the input signal transmission passage 170 in the device, to control the potential of the input signal to a proper value.

FIG. 7 shows the detailed forms of the light emitting diode 175 and the light receiving diode 176 which constitute the signal level decreasing circuit 174.

In FIG. 7, the lead wire 175b of the light emitting diode 175 is bent at right angles, and the lead wire 175b passed through a though hole is soldered to a land portion of the conduction passage 171 formed on the rear side of the circuit substrate 100C to mount the light emitting diode 175 on the front side of the video circuit substrate 100C. Reference numeral 175c denotes a solder portion. In addition, the lead wire 175b is extended along the surface of the video circuit substrate 100C so that a light emission portion 175a projects from the side edge of the circuit substrate 100C on the separation and light guide optical unit 30 side.

On the other hand, the lead wire 176b of the light receiving diode 176 is passed through a through hole and soldered to the land portion of the conduction passage 172 formed on the rear side of the audio circuit substrate 100B to mount the diode 176 on the front side of the audio circuit substrate 100B. The light receiving plane 176a of the light receiving diode 176 is arranged in parallel with the audio circuit substrate 100B to be opposite to the light emission portion 175a of the light emitting diode 175. Reference numeral 176c denotes a solder portion.

In this embodiment, the light emitting diode 175 is mounted on the front side of the video circuit substrate 100C together with other electronic components, and thus the lead wire of the light emitting diode 175 can be soldered, by solder flowing, to the rear side of the video circuit substrate 100C together with terminals of other electronic components.

In the present embodiment, the intensity curve of the light emitted by the light emitting diode 175 has a peak of around 950 nm. A frequency of the light receiving diode 176 is about 36.7 KHz.

The distance between the light emitting diode 175 and light receiving diode 176 may be varied appropriately in accordance with the output power of the diode 175 and the sensitivity of the diode 176, so as to avoid noise from increasing in the output signal of the diode 176. In this embodiment, the distance is equal to or less than 20 cm.

Figure 8:
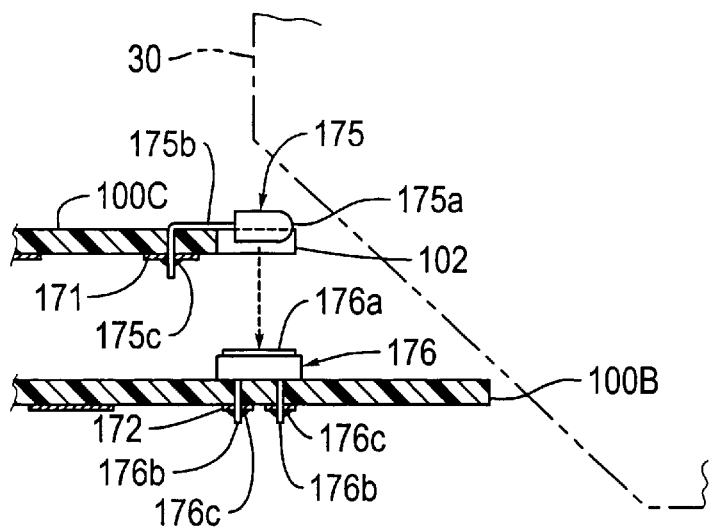
FIG. 8 is an enlarged horizontal sectional view of the periphery of signal transmission circuit (signal level decreasing circuit) as a principal portion of a second embodiment of the present invention.
Figure 9:
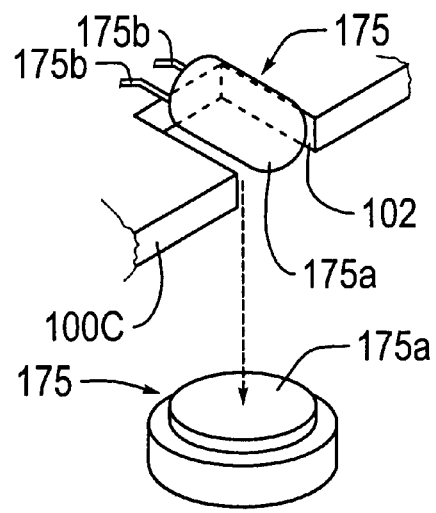
FIG. 9 is a perspective view of the same signal transmission circuit.

FIGS. 8 and 9 show a second embodiment of the present invention, in which FIG. 8 is an enlarged horizontal sectional view of the periphery of signal transmission circuit (signal level decreasing circuit) as a principal portion of the second embodiment, and FIG. 9 is a perspective view of the signal transmission circuit.

In the second embodiment, a notch 102 is formed at the side edge of the video circuit substrate 100C, which is a size larger than the light emission portion 175a of the light emitting diode 175, so that the light emitting diode 175 is mounted with the light emission portion 175a placed in the notch 102.

Since the light emitting diode 175 is provided in the video circuit substrate 100C (the light emission portion 175a does not project outward from the video circuit substrate 100C), the light emitting diode 175 (the light emission portion 175a) is less likely to contact other members when an electronic component is mounted or the video circuit substrate 100C is contained in the device case 10, thereby enabling a smooth work.

Since the light emitting diode 175 is not projected outward from the video circuit substrate 100C, the space for containing the circuit substrate in the device case 10 can be narrowed in the length direction of the circuit substrate, thereby further making the device compact.

Figure 10:
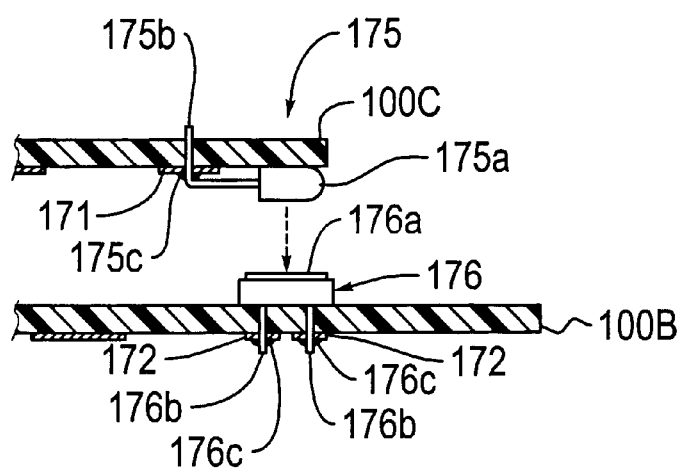
FIG. 10 is an enlarged horizontal sectional view of the periphery of signal transmission circuit (signal level decreasing circuit) as a principal portion of a third embodiment of the present invention.

FIG. 10 is an enlarged horizontal sectional view of the periphery of signal transmission circuit (signal level decreasing circuit) as a principal portion of a third embodiment of the present invention.

In the first and second embodiments, the light emitting diode 175 is mounted on the front side of the video circuit substrate 100C. However, in the third embodiment, the light emitting diode 175 is mounted on the rear side of the circuit substrate 100C so that the light emitting diode 175 (the light emission portion 175a) is not projected outward from the circuit substrate 100C.

In this embodiment, since the light emitting diode 175 is not provided on the front side of the circuit substrate 100C, many electronic components can be mounted on the front side. Also, since the light emission portion 175a of the light emitting diode 175 is located closer to the light receiving plane 176a of the light receiving diode 176, signals can correctly be transmitted.

Figure 11:
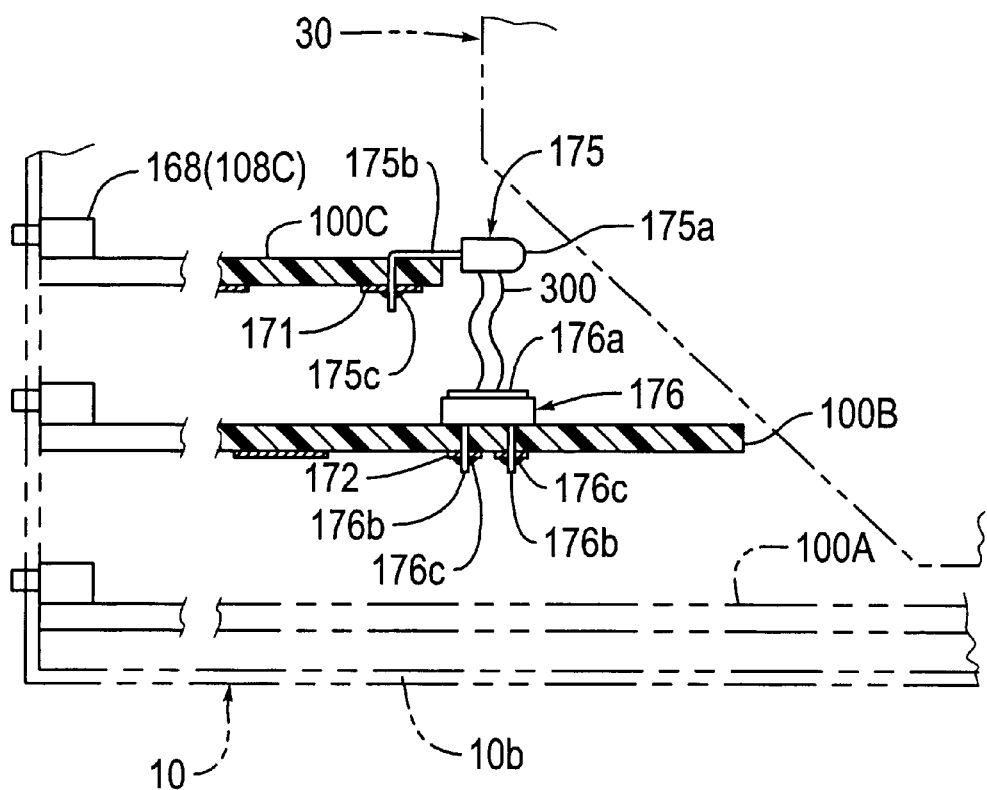
FIG. 11 is an enlarged horizontal sectional view of the periphery of signal transmission circuit (signal level decreasing circuit) provided between circuit substrates.

The fourth embodiment indicated in FIG. 11 is the same as the above mentioned embodiments except for the point that an optical fiber 300 or a light guide is provided between the light emitting diode 175 and light receiving diode 176. The optical fiber 300 is optically connected with these diodes 175 and 176. By means of the optical fiber 300, the noise in the signal from the light receiving diode 176 decreases. Furthermore, the flexibility upon designing the circuit substrates 100A, 100B and 100C increases, because the positions of the diodes 175 and 176 are less restricted in this embodiment than in a case without the optical fiber 300.

The present invention is not limited to the above-mentioned embodiments, and various embodiments can be made within the range of the gist of the invention. For example, the modification below can be made.

In the above embodiments, the signal level decreasing circuit 174 (the light emitting diode 175 and the light receiving diode 176) is provided between the signal transmission passages (the conduction passages) of the video circuit substrate 100C and the audio circuit substrate 100B, and the lead wire 177 (refer to FIG. 5) is provided between the signal transmission passages (the conduction passages) of the audio circuit substrate 100B and the main circuit substrate 100A. However, the signal level decreasing circuit 174 (the light emitting diode 175 and the light receiving diode 176) may be provided between the conduction passages of the video circuit substrate 100C and the main circuit substrate 100A so that a signal input to the video circuit substrate 100C is input directly to the main circuit substrate 100A without passing through the audio circuit substrate 100B.

The light emitting diode 175 described in the above mentioned embodiments may be replaced with an element like a semiconductor laser element. Additionally, the light receiving diode 176 described in the above embodiments may be replaced with an element such as a photoconductive cell or a phototransistor element.

Also, in the above embodiments, the control circuit substrate 100 comprises the three circuit substrates including the main circuit substrate 100A, the audio circuit substrate 100B and the video circuit substrate 100C. However, the control circuit substrate 100 may comprise two circuit substrates including an audio/video circuit substrate formed by integrating the audio circuit substrate and the video circuit substrate, and the main circuit substrate, or the main circuit substrate integrated with the audio circuit substrate and the video circuit substrate. In this way, the control circuit substrate may comprise two circuit substrates including the first circuit substrate on which the control circuit is mounted, and the second circuit substrate on which the external light receiving unit connecting terminal is provided, and the signal level decreasing circuit 174 (the light emitting diode 175 and the light receiving diode 176) may be provided between the signal transmission passages (the conduction passages) of both circuit substrates.

In the above embodiments, the present invention is applied to the projection display device including the light transmission type liquid crystal panels (liquid crystal light valves 80A, 80B and 80C) which transmit light so as to modulate it. However, the present invention may be applied to projection display devices including reflection type panels, e.g., DMD™ as well as reflection type LC panels, which reflect light so as to modulate it.

What is claimed is:

1. A projection display device comprising:

a light source;

an optical system that optically processes light emitted from the light source to form an optical image corresponding to image information;

a projection lens that projects the optical image formed by the optical system on a projection plane;

a device case containing at least the light source and the optical system;

a control circuit substrate contained in a predetermined space in the device case, the control circuit substrate having a mounted thereon a control circuit that controls driving of a device thereon;

an external apparatus connecting terminal provided on the control circuit substrate through which the control circuit is operated by an input operation signal from an external apparatus; and a signal transmission circuit having a light emitting element and a light receiving element and provided in an external input signal transmission passage between the terminal and the control circuit, the control circuit substrate comprising a first circuit substrate on which the control circuit and the light receiving element are provided, and a second circuit substrate arranged opposite to the first circuit substrate, the second circuit substrate having mounted thereon the external apparatus connecting terminal and the light emitting element.

2. The projection display device according to claim 1, the first circuit substrate comprising a main circuit substrate on which the control circuit is mounted, and a sub-circuit substrate which is connected to the main circuit substrate by electric wiring, arranged between the main circuit substrate and the second circuit substrate, and provided with the light receiving element.

3. The projection display device according to claim 1, the light receiving element being provided on a side facing the second circuit substrate so that a light receiving plane of the light receiving element is parallel to the first circuit substrate, and a light emission portion of the light emitting element is opposite to the light receiving plane of the light receiving element.

4. The projection display device according to claim 1, an end of a lead wire led out from a light emission portion of the light emitting element being mounted to a surface of the second circuit substrate, and the lead wire is bent along the surface of the second circuit substrate.

5. The projection display device according to claim 4, the light emission portion being provided so that at least an end thereof projects from a side edge of the second circuit substrate.

6. The projection display device according to claim 4, a notch being formed at the side edge of the second circuit substrate, and the light emission portion being provided so that at least a portion thereof projects into the notch.

7. The projection display device according to claim 1, the light emitting element being mounted on a surface of the second substrate which is opposite to the first circuit substrate.

8. The projection display device according to claim 1, the light emitting element being mounted on a surface of the second circuit substrate which faces the first circuit substrate.

9. The projection display device according to claim 1, the first circuit substrate being arranged along a side wall of the device case, and the second circuit substrate being arranged in a substantially triangular space formed between the optical system and the device case.

* * * * *